US008591688B2

(12) United States Patent
Iwase et al.

(10) Patent No.: US 8,591,688 B2
(45) Date of Patent: *Nov. 26, 2013

(54) FUNCTIONAL FILM AND METHOD FOR PRODUCING THE SAME

(75) Inventors: Eijirou Iwase, Kanagawa (JP); Takashi Kataoka, Kanagawa (JP); Toyoaki Hieda, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 298 days.

This patent is subject to a terminal disclaimer.

(21) Appl. No.: 12/902,411

(22) Filed: Oct. 12, 2010

(65) Prior Publication Data
US 2011/0091742 A1    Apr. 21, 2011

(30) Foreign Application Priority Data

Oct. 15, 2009   (JP) ................................. 2009-238398

(51) Int. Cl.
*B32B 38/10*    (2006.01)
*B32B 27/00*    (2006.01)

(52) U.S. Cl.
USPC ......... 156/247; 156/150; 427/251; 427/255.5

(58) Field of Classification Search
USPC ............................... 427/251, 255.5; 156/150
IPC ....................................................... B32B 38/10
See application file for complete search history.

(56) References Cited

U.S. PATENT DOCUMENTS

| | | |
|---|---|---|
| 2,367,660 A | 1/1945 | Agre |
| 2,448,828 A | 9/1948 | Renfrew |
| 2,681,294 A | 6/1954 | Beguin |
| 2,722,512 A | 11/1955 | Crandall |
| 2,951,758 A | 9/1960 | Notley |
| 3,046,127 A | 7/1962 | Barney et al. |
| 3,549,367 A | 12/1970 | Chang et al. |
| 3,870,524 A | 3/1975 | Watanabe et al. |
| 4,038,257 A | 7/1977 | Suzuki et al. |

(Continued)

FOREIGN PATENT DOCUMENTS

| | | |
|---|---|---|
| JP | 48-64183 | 9/1973 |
| JP | 48-41708 | 12/1973 |

(Continued)

OTHER PUBLICATIONS

Extended European Search Report issued Jun. 10, 2010 in European Patent Application No. 10154815.4, 7 pages.

(Continued)

*Primary Examiner* — William Bell
(74) *Attorney, Agent, or Firm* — Young & Thompson

(57) ABSTRACT

A method for producing a functional film, comprising the steps of:
feeding a substrate continuously from a film roll, forming a coating film on the substrate, providing a laminate film on a surface of the coating film, and winding up the resultant substrate into a film roll; and
loading the film roll wound up in the prior step into a vacuum film-forming apparatus, feeding the substrate provided with the laminate film continuously from the film roll, peeling off the laminate film, forming an inorganic film on the coating film on the substrate, and winding up the resultant substrate into a film roll,
wherein for the laminate film, an adhesive film having an adhesive layer having a peel force of 0.01 N/25 mm or more and 0.06 N/25 mm or less against the coating film is used.

5 Claims, 2 Drawing Sheets

(56) References Cited

U.S. PATENT DOCUMENTS

| | | | |
|---|---|---|---|
| 4,212,976 A | 7/1980 | Shen et al. | |
| 4,239,850 A | 12/1980 | Kita et al. | |
| 5,589,007 A * | 12/1996 | Fujioka et al. | 136/249 |
| 5,725,909 A | 3/1998 | Shaw et al. | |
| 6,602,347 B1 | 8/2003 | Shimoda et al. | |
| 7,635,525 B2 | 12/2009 | Iwanaga | |
| 2001/0055647 A1* | 12/2001 | Tamura et al. | 427/177 |
| 2002/0018883 A1* | 2/2002 | Okazaki et al. | 428/220 |
| 2002/0176169 A1 | 11/2002 | Shoshi et al. | |
| 2005/0079380 A1* | 4/2005 | Iwanaga | 428/688 |
| 2006/0273219 A1 | 12/2006 | McCollough et al. | |
| 2009/0233108 A1 | 9/2009 | Tsukamoto | |
| 2010/0215986 A1 | 8/2010 | Iwase et al. | |
| 2010/0247810 A1 | 9/2010 | Yukinobu et al. | |

FOREIGN PATENT DOCUMENTS

| | | |
|---|---|---|
| JP | 49-43191 | 11/1974 |
| JP | 50-6034 | 3/1975 |
| JP | 51-37193 | 3/1976 |
| JP | 51-48516 | 12/1976 |
| JP | 52-30490 | 8/1977 |
| JP | 06060374 | 3/1994 |
| JP | 06-228752 | 8/1994 |
| JP | 08092727 | 4/1996 |
| JP | 11-133600 | 5/1999 |
| JP | 2000-127328 | 5/2000 |
| JP | 2002-264274 | 9/2002 |
| JP | 2002-286908 | 10/2002 |
| JP | 2003-118046 | 4/2003 |
| JP | 2003-205569 | 7/2003 |
| JP | 2003-276037 | 9/2003 |
| JP | 2006-036904 | 2/2006 |
| JP | 2006-043965 | 2/2006 |
| JP | 2007-261052 | 10/2007 |
| JP | 2009-221541 | 10/2009 |
| JP | 2010-222702 | 10/2010 |
| JP | 2010-234340 | 10/2010 |
| WO | 00/77118 | 12/2000 |
| WO | 2007138837 | 12/2007 |
| WO | 2009057637 | 5/2009 |
| WO | 2010024149 | 3/2010 |

OTHER PUBLICATIONS

Charton et al., "Development of high barrier films on flexible polymer substrates", Thin Solid Films, vol. 502, No. 1-2, Aug. 15, 2005, pp. 99-103, xp-025006223.

Harris, "Review of Organic Light Emitting Diode Fabrication and Recent Progress", Soft Electronics Final Paper, May 4, 2008, pp. 1-6, XP-002583090.

Chinese Office Action dated Dec. 31, 2012 in corresponding Chinese Patent Application No. 201010126475.7 with English translation cited in the IDS of Jan. 30, 2013 for U.S. Appl. No. 12/712,981.

Notice of References Cited, which was attached to the Final Office Action of Mar. 23, 2012 for U.S. Appl. No. 12/712,981.

IDS filed on Jan. 19, 2012 and Jan. 30, 2013 for U.S. Appl. No. 12/712,981.

JP Office Action dated Jul. 1, 2013, with partial English translation; Application No. 2009-238398.

JP Office Action dated Jul. 1, 2013, with partial English translation; Application No. 2010-042509.

"Polymer Dictionary, New Edition" Compiled by the Society of Polymer Science, Asakura Publishing Co., Ltd., Mar. 20, 2001, First Edition, Sixth Printing, pp. 384-385 (No English Translation Available).

* cited by examiner

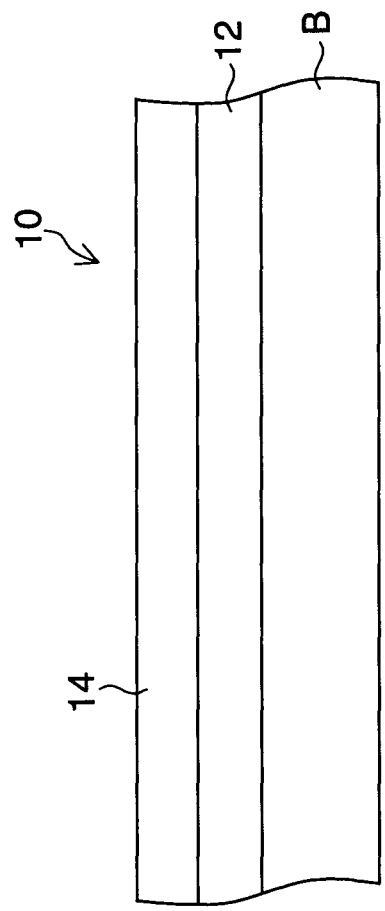

FUNCTIONAL FILM AND METHOD FOR PRODUCING THE SAME

BACKGROUND OF THE INVENTION

1. Field of the Invention

The present invention relates to a functional film, and a method for producing the functional film. More specifically, the present invention relates to a functional film having a laminated structure, which is provided by feeding a substrate having a coating film formed thereon from a film roll obtained by winding up the substrate and forming an inorganic film on the coating film, and to a method for producing the functional film.

2. Description of the Related Art

Functional films such as gas barrier films, protective films, optical filters, and anti-reflection films are used in a variety of devices, for example, optical elements, display devices such as liquid crystal display and organic EL display; semiconductor devices; and thin-film solar cells.

Meanwhile, for producing these functional films, film formation techniques through vacuum film forming methods such as sputtering, and plasma CVD method are used. In order to efficiently form a film while ensuring high productivity, it is carried out to continuously form a film on a lengthy base material.

One method for producing the above-mentioned functional film in described below. A lengthy substrate is continuously fed from a film roll. Then, a coating liquid is coated on the substrate, dried and cured to form a coating film, and the substrate having the coating film formed thereon is wound up to thereby produce a film roll. Next, the film roll having the coating film formed thereon is placed in a feeding section of a vacuum film-forming apparatus, and the substrate is continuously fed from the film roll to a film formation chamber. Then, in the film formation chamber, an inorganic film is formed on the coating film to form a film having a laminated structure composed of the coating film and the inorganic film, and the film having a laminated structure is wound up, thereby producing a film roll. As equipment for carrying out such a film forming method, there has been known a so-called roll-to-roll film-forming apparatus. By repeating the process for forming a coating film and an inorganic film at plural times by the film-forming apparatus, it is possible to produce a functional film having a plurality of laminated structures.

In the above production method, in order to prevent winding misalignments during film formation of an inorganic film and to maintain uniform quality of a resulting functional film, Japanese Patent Application Laid-Open No. 08-92727 describes a method in which a film roll wound with a winding hardness of 70 to 95 is placed in a feeding section of a vacuum film-forming apparatus, and an inorganic film is continuously formed on a substrate.

Further, Japanese Patent Application Laid-Open No. 06-60374 describes a method in which a wound roll of a lengthy plastic film is introduced into a vapor deposition chamber, the inside of the vapor deposition chamber is depressurized to a pressure of 20 Torr over 2 minutes or more, and subsequently the inside of the chamber is vacuum evacuated to a usual vapor deposition pressure, thereby making a ferromagnetic alloy or an alloy adhere on the plastic film by a vapor deposition method.

SUMMARY OF THE INVENTION

However, even if a film roll having a coating film formed thereon is wound with a winding hardness of 70 to 95 as described in Japanese Patent Application Laid-Open No. 08-92727, the film roll unfavorably picks up entrained air when the substrate is wound up. When a film roll entrained with air is placed in a feeding section in a depressurized vacuum film-forming apparatus, the entrained air in the film roll comes out of the film roll. With this, the balance of stress in winding up (tension, frictional force) inside the film roll is disrupted, and the film roll tends to cause "tight winding" (shrinkage of roll diameter).

If a film roll causes the "tight winding", a coating film formed on a substrate scrapes against a back surface of the substrate which is rolled and positioned above the coating film and comes into contact with dust attached to the back surface of the substrate, and microscopic film rupture occurs in the coating film, resulting in a lost of smoothness of the film in the film roll. Subsequently, when the substrate is conveyed and an inorganic film is formed on the coating film, film-forming failure occurs to cause cracks/deficiencies of the inorganic film.

The method described in Japanese Patent Application Laid-Open No. 06-60374 has been proposed in an attempt to prevent winding misalignments in the width direction of a film roll by reducing the pressure to 20 Torr for at least 2 minutes in the beginning of evacuation. However, it turned out that in this condition, it is impossible to completely prevent winding misalignment due to tight winding in a radial direction (shrinkage).

Further, in the method described in Japanese Patent Application Laid-Open No. 06-60374, since the pressure inside a vapor deposition chamber is reduced in a state where a film roll has been introduced in the vapor deposition chamber, the entire inside of the vapor deposition chamber needs to be depressurized to a pressure required for vapor deposition. Therefore, if it takes time for depressurization in order to prevent winding misalignments, the total depressurization time required for forming a film is much longer, which causes such a drawback that the productivity decreases. Particularly, in the case of a vapor deposition device capable of producing a large film roll, a vapor deposition chamber used therefor should be increased in inside capacity, and the total duration time for depressurization thus becomes significantly long, causing a considerable reduction in productivity.

The present invention has been made in light of the above-mentioned practical situations, and an object of the present invention is to provide a functional film, which can suppress the occurrence of defects, such as cracks/deficiencies of an inorganic film when the inorganic film is formed on a coating film by a vacuum film-forming method and which is of high productivity and a method for producing the functional film.

To achieve the above object, the method for producing a functional film according to the present invention includes steps of feeding a substrate continuously from a film roll, forming a coating film on the substrate, providing a laminate film on a surface of the coating film, and winding up the resultant substrate into a film roll; and loading the film roll wound up in the prior step into a vacuum film-forming apparatus, feeding the substrate provided with the laminate film continuously from the film roll, peeling off the laminate film, forming an inorganic film on the coating film on the substrate, and winding up the resultant substrate into a film roll, wherein for the laminate film, an adhesive film having an adhesive layer having a peel force of 0.01 N/25 mm or more and 0.06 N/25 mm or less against the coating film is used.

In order to achieve the above object, the present inventors have found a method in which, first, the surface of the coating film is covered with the laminate film to thereby protect the coating film from direct contact with the back surface of the substrate. More specifically, after the coating film is coated on the surface of the substrate, dried and cured, the substrate is wound up while superimposing the laminate film on the surface of the coating film.

The coating film thus covered with a laminate film is set, in a wound-up shape, in a vacuum film-forming apparatus, but the coating film is not damaged by tight winding at the time of vacuum evacuation. Further, formation of an inorganic film also becomes possible without the coating film being damaged during the course of handling since the substrate is conveyed to the vacuum film-forming apparatus with the coating film protected with the laminate film, and the laminate film is peeled off just before formation of the inorganic film on the coating film.

However, the important thing here is that a material (having adhesion, etc.) for use in the laminate film is required to have an optimum function sufficient to be used in a vacuum.

With use of a strongly adhesive laminate film, there is a problem that the adhesion force of the laminate film is increased by removing air entrained between the coating film and the laminate film in a vacuum, and thereby the coating film may be ruptured by peeling off the laminate film therefrom.

In contrast, with use of a laminate film having too weak adhesion, the laminate film cannot be neatly affixed to the coating film. This causes wrinkles and abnormal winding appearance of the coating film.

Further, when a substance is used and applied onto the laminate film in order to obtain the adhesion of the laminate film, an adhesive residue remains on the coating film side at the time of the peeling-off, due to the increased adhesion force, and the adhesive residue may be incorporated as a foreign matter when an inorganic film is formed on the coating film.

The present inventors have found that a film rupture occurs in the form of a film roll by reducing the pressure inside a vacuum deposition chamber to obtain a vacuum state, without the substrate provided with the coating film being conveyed, and found out, in order to protect the coating film, a adhesion force between the coating film and the laminate film, particularly when employed in a vacuum, is important. This phenomenon of film rupture is a highly serious problem, because especially when a multilayer of coating films/inorganic films is formed by repeatedly forming a coating film in the atmosphere and forming an inorganic film in a vacuum, the phenomenon exerts influence upon each of the lamination stack.

Then, the present inventors have obtained a knowledge that for a laminate film for protecting a coating film in a vacuum, there is a need to use a laminate film having such a degree of adhesion that it can be smoothly peeled off in a vacuum, and more specifically, it is suitable to use an adhesive film having an adhesion layer having a peel force of 0.01 N/25 mm or more and 0.06 N/25 mm or less against the coating film.

According to the present invention, after a coating film is applied onto a substrate and dried to cure the coating film, an adhesive film having an adhesive layer having a peel force of 0.01 N/25 mm or more and 0.06 N/25 mm or less against the coating film is formed as a laminate film on the surface of the coating film layer, and the substrate is wound up into a film roll while the adhesive film being superimposed on the coating film; the film roll is placed in a vacuum film-forming apparatus; and the laminate film is peeled off from the coating film before forming an inorganic film on the surface of the coating film. Thereby, it is possible to provide a method for producing a functional film, which is capable of suppressing the occurrence of defects such as cracks/deficiencies of the inorganic film attributable to peeling off a laminate film from a coating film, without impairing the smoothness of the coating film and which is of high productivity.

In the present invention, the adhesive film is preferably provided with an adhesive layer through co-casting.

By using a laminate film to which an adhesive layer is provided through co-casting (adhesive film), an adhesive material hardly remains on a surface of the coating film, and it is possible to minimize adverse effect on a film formed in vacuum because the amount of degassing from the adhesive material is reduced, and thus the occurrence of defects such as cracks/deficiencies of an inorganic film can be further suppressed.

Also, the moisture permeability of the functional film can be made less than $1.0 \times 10^{-3}$ g/m$^2$/day by the method for producing a functional film of the present invention.

Further, in the method for producing a functional film of the present invention, the coating film is preferably formed from a material containing one of a radiation curable monomer and a radiation curable oligomer.

The present invention is particularly effective when the coating film is formed from a material containing one of a radiation curable monomer and a radiation curable oligomer.

To achieve the above object, the functional film of the present invention is a functional film produced by the method for producing a functional film described above.

A functional film produced by the method for producing a functional film of the present invention can be suitably used as a variety of functional films such as optical elements, display devices, semiconductor devices, and thin-film solar cells, because the occurrence of defects such as cracks/deficiencies of the inorganic film is suppressed.

According to the present invention, it is possible to provide a functional film and a method for producing the functional film, which can suppress the occurrence of defects of an inorganic film when the inorganic film is formed on a coating film by a vacuum film-forming method and which is of high productivity.

BRIEF DESCRIPTION OF THE DRAWINGS

FIG. 1 is a diagram illustrating a functional film produced by a method for producing a functional film.

DETAILED DESCRIPTION OF THE PREFERRED EMBODIMENTS

Figure 2A:
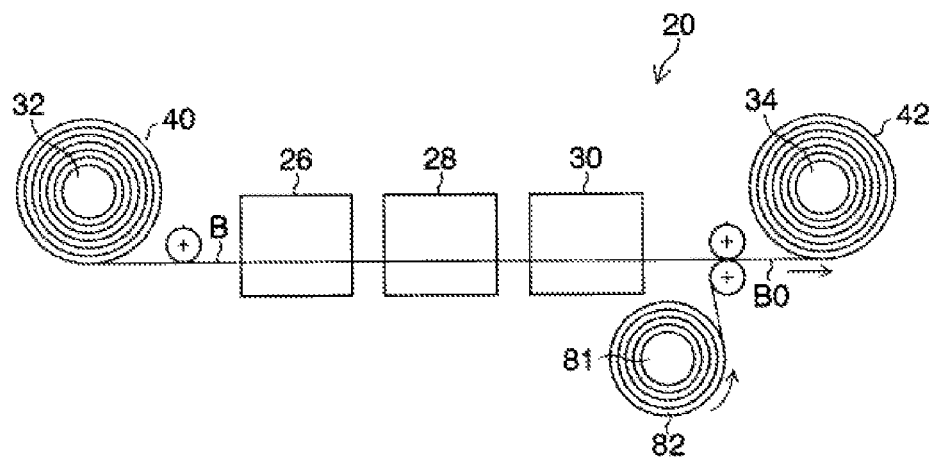
FIGS. 2A and 2B are diagrams illustrating one example of a device for carrying out a method for producing a functional film.

Hereinafter, preferred embodiments of the present invention will be described according to the appended drawings. The present invention will be described through the following preferred embodiments; however, various modifications may be made by a number of methods without departing from the scope of the present invention, and embodiments other than the following embodiments can be utilized. Accordingly, the claims include all modifications within the scope of the present invention. Additionally, the numerical range expressed herein by the wording "one number to another number" means the range that includes both the former number and the latter number.

The following describes a method for producing a functional film according to the present invention.

FIG. 1 is a diagram for illustrating a concept of a functional film produced by the method for producing a functional film.

As illustrated in FIG. 1, in the method for producing a functional film, a predetermined coating film 12 is formed on a surface of a substrate B (film raw fabric), and an inorganic film 14 is formed on the coating film 12 by a film forming method to produce a laminate (hereinafter referred to as functional film, laminate film or optical film) 10.

In the method for producing a functional film, by way of example, the laminate film 10 is produced by a coating film-forming apparatus 20 which forms the coating film 12 on a surface of the substrate B and an inorganic film-forming apparatus 22 which forms the inorganic film 14 on a surface of the coating film 12.

FIG. 2A conceptually illustrates one example of the coating film-forming apparatus 20 for carrying out the method for producing a functional film.

The coating film-forming apparatus 20 includes a coating device 26, a heating device 28 and an UV (ultraviolet ray) irradiation device 30. With the coating film-forming apparatus 20, the coating film 12 is formed by applying a coating liquid, which has been prepared beforehand and contains a radiation curable monomer or oligomer, onto the substrate B by means of the coating device 26, drying by means of the heating device 28, and polymerizing the monomer or the oligomer by mean of the UV irradiation device 30.

This coating film-forming apparatus 20 forms a coating film by a roll-to-roll process. The substrate B is loaded, as a base material roll 40, on a rotating shaft 32. While the substrate B is conveyed in the longitudinal direction, a coating film is formed on the substrate B. A substrate Bo on which the coating film has been formed is wound up as a film roll 42 by a wind-up shaft 34.

The substrate B fed from the base material roll 40 is first conveyed to the coating device 26. The coating device 26 applies to a surface of the substrate B a coating liquid, which has been prepared beforehand and contains a radiation curable monomer or oligomer, and will become the coating film 12. All of the common liquid coating methods can be utilized as a method for applying the costing liquid.

The substrate B is next conveyed to the heating device 28. In the heating device 28, a solvent contained in the coating liquid that has been applied by the coating device 26 is dried. The heating method of the coating liquid is not particularly limited, and any known heating devices, such as heating by a heater and heating by hot air flow, can be employed, as long as they can heat and dry the coating liquid according to the conveying speed of the substrate B, etc., before the substrate B reaches the UV irradiation device 30.

The substrate B is next conveyed to the UV irradiation device 30. The UV irradiation device 30 forms the coating film 12 through polymerization of the radiation curable monomer or oligomer by irradiating ultraviolet ray on the coating liquid which has been applied by the coating device 26 and heated and dried by the heating device 28.

Then, in the present invention, a laminate film 82 is wound off from a laminate film unwinder 81 and the laminate film 82 is wound on the substrate (film) Bo and wound up by the wind-up shaft 34.

Figure 2B:
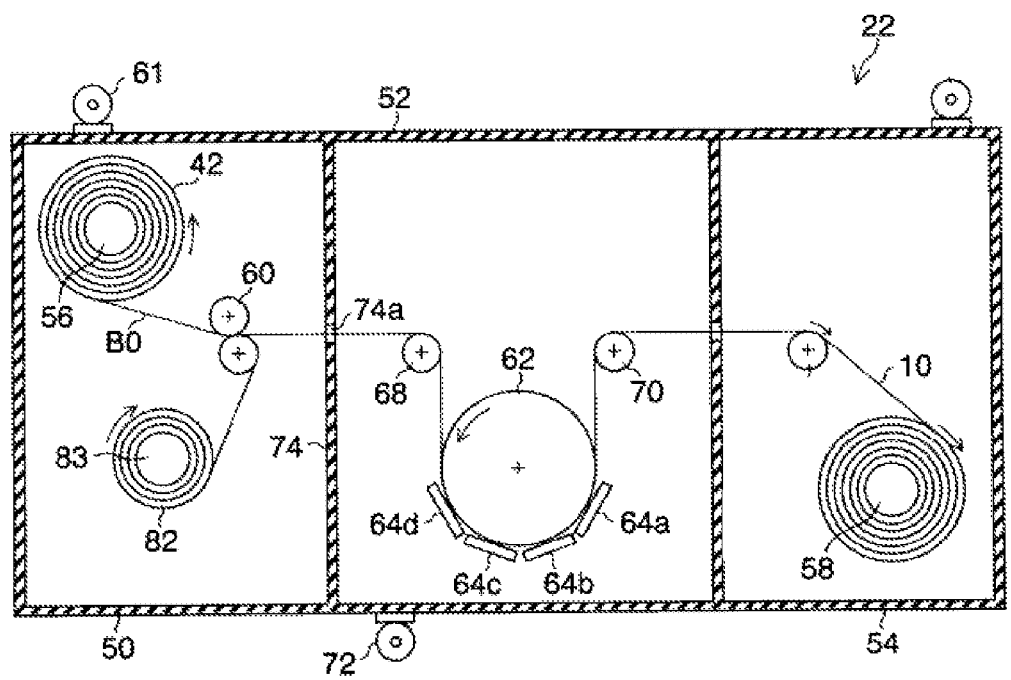

Subsequently, a film roll 42 obtained by winding the substrate Bo on which the coating film 12 has been formed is loaded in the inorganic film-forming apparatus 22, which is conceptually illustrated in FIG. 2B.

The inorganic film-forming apparatus 22 forms the inorganic film 14 by a vacuum film-forming method on the surface of the substrate Bo (namely on the surface of the coating film 12). The inorganic film-forming apparatus 22 includes a supply chamber 50, a film formation chamber 52, and a wind-up chamber 54.

The inorganic film-forming apparatus 22 performs film formation by a roll-to-roll method as is the case with the coating film-forming apparatus 20. In the inorganic film-forming apparatus 22, the substrate Bo is fed from the film roll 42. While the substrate Bo is conveyed in the longitudinal direction, the inorganic film 14 is formed on the substrate Bo. Then, the functional film 10 on which the coating film 12 and the inorganic film 14 are formed is wound up in the form of a roll by a wind-up shaft 58.

The supply chamber 50 includes a rotating shaft 56, a guide roller (pass roller) 60, and a vacuum evacuation device 61. In addition, the supply chamber 50 includes a laminate film wind-up device 83 for winding up the laminate film 82 wound around the substrate Bo of the film roll 42 by the coating film-forming apparatus 20.

In the inorganic film-forming apparatus 22, the film roll 42, in which the substrate Bo having the coating film 12 formed on the substrate B and the laminate film 82 are wound, is loaded on the rotating shaft 56 in the supply chamber 50. When the film roll 42 is loaded on the rotating shaft 56, the substrate Bo is passed (conveyed) through a predetermined conveying path from the supply chamber 50, through the film formation chamber 52, to the wind-up shaft 58 in the wind-up chamber 54. In the inorganic film-forming apparatus 22, also, feeding of the substrate Bo from the film roll 42 is performed in synchronization with winding of the functional film 10 on the wind-up shaft 58, and the inorganic film 14 is formed on the substrate Bo continuously while the lengthy substrate Bo is conveyed in the longitudinal direction along the predetermined conveying path.

In the supply chamber 50, the substrate Bo is fed from the film roll 42 by rotating the rotating shaft 56 in a clockwise direction as viewed in the figure by means of a not illustrated drive source. Then, the substrate Bo is guided along a predetermined path by the guide roller (pass roller) 60, and is conveyed to the film formation chamber 52.

Further, the vacuum evacuation device 61 is disposed in the supply chamber 50. The vacuum evacuation device 61 depressurizes the inside of the supply chamber 50 to a predetermined degree of vacuum (pressure) corresponding to a film-forming pressure in the film formation chamber 52. This prevents the pressure in the supply chamber 50 from adversely affecting the pressure (film formation) in the film formation chamber 52. In addition, as the vacuum evacuation device 61, there may be used a known vacuum evacuation device as is the case with an after-mentioned vacuum evacuation device 72 in the film formation chamber 52.

Furthermore, in the supply chamber 50, there may be disposed, in addition to the members illustrated in the figure, various members (conveying devices) for conveying the substrate Bo along the predetermined path, such as a pair of conveying rollers and a guide member for controlling the position of the substrate Bo in the width direction thereof.

The substrate Bo is guided by the guide roller 60 and conveyed into the film formation chamber 52.

In the film formation chamber 52, the inorganic film 14 is formed on the surface of the substrate Bo (namely, on the surface of the coating film 12) by a vacuum film-forming method. In the illustrated example, the film formation chamber 52 includes a drum 62, film-forming devices 64a, 64b, 64c, and 64d, guide rollers 68 and 70, and the vacuum evacuation device 72. Note that when the film formation chamber 52 is one for film-formation by means of sputtering, plasma CVD, or the like, there is further installed, in the film formation chamber 52, a high-frequency power source and the like.

The substrate Bo is conveyed into the film formation chamber 52 through a slit 74a formed on a partition wall 74 which divides the supply chamber 50 and the film formation chamber 52.

The diagrammatically exemplified inorganic film-forming apparatus 22 may include, as a preferred aspect, vacuum evacuation devices installed also in the supply chamber 50 and the wind-up chamber 54. In this case, depending on the film-forming pressure in the film formation chamber 52, the supply chamber 50 and the wind-up chamber 54 are also brought to a vacuum. However, the apparatus whereby the present invention is carried out is not limited thereto. For example, while vacuum evacuation devices may not be installed in the supply chamber 50 and the wind-up chamber 54. In this case, by adjusting the size of slits, through which the substrate Bo passes, to the least possible size for the substrate Bo to pass through without the substrate Bo contacting the substrate Bo, the film formation chamber 52 may be made substantially airtight. Alternatively, without installing vacuum evacuation devices in the supply chamber 50 and the wind-up chamber 54, sub-chambers through which the substrate Bo passes may be installed between the supply chamber 50 and the film formation chamber 52, and between the wind-up chamber 54 and the film formation chamber 52. Inside of these sub-chambers may be vacuumized by a vacuum pump.

In addition, when a sub-chamber and the like are installed upstream of the film formation chamber 52 (upstream of the conveying direction of the substrate Bo), in the case where the device for conveying the base material inside this sub-chamber and the like also contacts the coating film 12, the device should be constituted in such a way that the device contacts only the ends of the substrate Bo.

The drum 62 in the film formation chamber 52 is a cylindrical member which rotates in a counterclockwise direction in the figure with its central axis as the center.

The substrate Bo, fed from the supply chamber 50 and guided to a predetermined path by the guide roller (pass roller) 68, is wound around the drum 62. And, the substrate Bo, while being supported and guided by the drum 62, is conveyed along the predetermined conveying path. The inorganic film 14 is formed on the surface (on the coating film 12) by means of the film-forming devices 64a to 64d and the like. Further, when the film formation chamber 52 is one where film formation is conducted by sputtering, plasma CVD, and the like, the drum 62 may be grounded (earthed), or may be connected to a high-frequency power source so that the drum 62 functions as an opposite electrode.

The film-forming devices 64a to 64d form the inorganic film 14 on the surface of the substrate B by a vacuum film-forming method.

Here, in the production method of the present invention, there is no particular limitation to the method for forming the inorganic film 14. Any known vacuum film-forming methods (vapor-phase deposition methods) are applicable, including CVD, plasma CVD, sputtering, vacuum vapor deposition, ion plating, and the like.

Therefore, the film-forming devices 64a to 64d can include various members, corresponding to a vacuum film-forming method to be carried out.

For example, when the film formation chamber 52 is one where formation of the inorganic film 14 is conducted by an ICP-CVD method (inductively-coupled plasma CVD), each of the film-forming devices 64a to 64d may include an induction coil to form an induced magnetic field, and a gas supply device to supply a reactive gas to the film-forming area and the like.

When the film formation chamber 52 is one where formation of the inorganic film 14 is conducted by a CCP-CVD method (capacitively-coupled plasma CVD), each of the film-forming devices 64a to 64d may include a shower electrode which functions as a high-frequency electrode, a reactive gas supply device and the like. The shower electrode may be hollow, connected to a supply source of a reactive gas, and have many small openings on its surface facing the drum 62.

When the film formation chamber 52 is one where formation of the inorganic film 14 is conducted by a CVD method, each of the film-forming devices 64a to 64d may include a reactive gas supply device and the like.

Further, when the film formation chamber 52 is one where formation of the inorganic film 14 is conducted by sputtering, each of the film-forming devices 64a to 64d may include a target holding device, a high-frequency electrode, a sputtering gas supply device and the like.

The vacuum evacuation device 72 vacuum evacuates the inside of the film formation chamber 52 and brings the chamber to a degree of vacuum corresponding to formation of the inorganic film 14 by a vacuum film-forming method.

There is no limitation either on the vacuum evacuation device 72. Vacuum pumps such as a turbo-pump, a mechanical booster pump, and a rotary pump can be utilized. Additionally, various known (vacuum) evacuation devices used in a vacuum film-forming apparatus, which utilize an auxiliary device such as a cryocoil, and a control device for the ultimate vacuum, air volume displacement, etc. can be utilized.

The substrate Bo on which the inorganic film 14 is formed by the film-forming devices 64a to 64d while being supported and conveyed by the drum 62, namely the functional film 10, is guided to a predetermined path by the guide roller 70, conveyed into the wind-up chamber 54, and wound up in the form of a roll by the wind-up shaft 58. The laminate film (functional film) roll wound up in the form of a roll is supplied to the next step.

As described above, the method for producing a functional film of the present invention includes a step of feeding the substrate B continuously from the base material roll 40, forming the coating film 12 on the substrate B to make the substrate Bo, providing the laminate film 82 on the surface of the coating film 12, and winding up the resultant substrate as the film roll 42; and a step of loading the film roll 42 wound up in the prior step into the inorganic film-forming apparatus 22, feeding the substrate Bo provided with the laminate film 82 continuously from the film roll 42, peeling off the laminate film 82 from the substrate Bo, forming the inorganic film 14 on the coating film 12 on the substrate B, and winding up the resultant substrate Bo as a film roll.

The coating film thus covered with a laminate film is set, in a wound-up shape, in a vacuum film-forming apparatus, however, the coating film is not damaged by tight winding at the time of vacuum evacuation. Further, formation of an inorganic film also becomes possible without the coating film being damaged during the course of handling since the substrate is conveyed to the vacuum film-forming apparatus with the coating film protected with the laminate film, and the laminate film is peeled off just before formation of the inorganic film on the coating film.

However, the important thing here is that a material (having adhesion) for use in the laminate film is required to have an optimum function sufficient to be used in a vacuum.

With use of a strongly adhesive laminate film, there is a problem that the adhesion force of the laminate film is increased by removing air entrained between the coating film and the laminate film in a vacuum, and thereby the coating film may be ruptured by peeling off the laminate film therefrom.

In contrast, with use of a laminate film having too weak adhesion, the laminate film cannot be neatly affixed to the coating film. This causes wrinkles and abnormal winding appearance of the coating film.

Further, when a substance is used and applied onto the laminate film in order to obtain the adhesion of the laminate film, an adhesive residue remains on the coating film side at the time of the peeling-off, due to the increased adhesion force, and the adhesive residue may be incorporated as a foreign matter when an inorganic film is formed on the coating film.

Then, in the present invention, for a laminate film for protecting a coating film in a vacuum, there is a need to use a laminate film having such a degree of adhesion that it can be smoothly peeled off in a vacuum, and more specifically, it is suitable to use an adhesive film having an adhesion layer having a peel force of 0.01 N/25 mm or more and 0.06 N/25 mm or less against the coating film. That is, the laminate film is made to have adhesiveness not rupturing the coating film in vacuum film formation and hardly leaving residues on the coating film when peeled off from the coating film.

According to the present invention, after a coating film is applied onto a substrate and dried to cure the coating film, an adhesive film having an adhesive layer having a peel force of 0.01 N/25 mm or more and 0.06 N/25 mm or less against the coating film is formed as a laminate film on the surface of the coating film layer, and the substrate is wound up into a film roll while the adhesive film being superimposed on the coating film; the film roll is placed in a vacuum film-forming apparatus; and the laminate film is peeled off from the coating film before forming an inorganic film on the surface of the coating film, thereby making it possible to provide a method for producing with high productivity a functional film, which is capable of preventing occurrence of defects such as cracks/ deficiencies of an inorganic film attributable to peeling off a laminate film from a coating film, without impairing the smoothness of the coating film.

In the present invention, the adhesive film is preferably provided with the adhesive layer through co-casting. When the laminate film itself is formed by melt film formation, by making the laminate film provided with an adhesive layer through co-casting, without attaching an adhesive material to the coating film at a later time, as in the case of applying it onto the coating film, a further suitable adhesive force can be achieved, and the amount of residues of the adhesive material can be reduced in the coating film. Thus, the present invention can provide a laminated functional film having high quality. In addition, by using a laminate film (adhesive film) to which an adhesive layer is provided through co-casting, adverse effect on a film formed in vacuum can be minimized because the amount of degassing from the adhesive material is reduced, and thus the occurrence of defects such as cracks/ deficiencies of an inorganic film can be further suppressed.

In the method for producing a functional film of the present invention, the laminate film 82 is preferably peeled off before formation of the inorganic film 14 and after the substrate Bo has passed through all the pass rollers which come into contact with the surface of the coating film side of the substrate Bo. Namely, in FIG. 2B, the laminate film 82 is preferably peeled off after the substrate Bo has passed the pass roller 68.

Also, similarly, in the method for producing a functional film of the present invention, the laminate film is preferably provided after curing of the coating film 12 and before a pass roller coming in contact with the coating film side of the substrate Bo.

In addition, the thickness of the laminate film 82 is preferably 10 μm or more and 300 μm or less.

Also, the inorganic film 14 is preferably formed in a thickness of 10 nm or more and 200 nm or less.

According to the method for producing a functional film of the present invention, the occurrence of defects such as cracks/deficiencies of an inorganic film can be suppressed and a method with high productivity for producing the functional film can be provided. Thus, the moisture permeability of the functional film can be controlled less than $1.0 \times 10^{-3}$ $g/m^2/day$.

Preferably, the coating film 12 is smooth and has high film hardness. The smoothness of the coating film 12 is, in terms of average roughness (Ra value) per 10 μm square, preferably 10 nm or less, more preferably 2 nm or less.

The film hardness of the coating film 12 is preferably not less than a certain level of hardness. The hardness, as a penetration hardness when measured by a nanoindentation measurement method, is preferably 100 $N/mm^2$ or higher, more preferably 200 $N/mm^2$ or higher. Further, in terms of pencil hardness, the film preferably has hardness of B or higher.

In the present invention, there is no particular limitation on the substrate B on which the coating film 12 and the inorganic film 14 are formed. As long as formation of the after-mentioned coating film 12 and inorganic film 14 by vacuum film-forming are possible, various base materials (base films) are all usable, including various resin films such as a PET film and various metal sheets such as an aluminum sheet, which are used in various functional films including gas barrier films, optical films, and protective films.

In addition, the substrate B may be one which has various films formed on its surface, such as a protective film and an adhesive film.

An applied film which constitutes the coating film 12 contains a radiation curable monomer or oligomer as the main component. Specifically, the monomer or oligomer to be used is preferably a monomer or oligomer which includes two or more ethylenically unsaturated double bonds and can undergo addition polymerization by irradiation of light. Examples of such a monomer or oligomer include a compound having in the molecule at least one ethylenically unsaturated group which can undergo addition polymerization and having a boiling point of 100° C. or higher under ordinary pressure. Examples of the monomer or oligomer include monofunctional acrylates or monofunctional methacrylates such as polyethylene glycol mono(meth)acrylate, polypropylene glycol mono(meth)acrylate, and phenoxyethyl (meth) acrylate; and polyfunctional acrylates or polyfunctional methacrylates such as polyethylene glycol di(meth)acrylate, polypropylene glycol di(meth)acrylate, trimethylolethane triacrylate, trimethylolpropane tri(meth)acrylate, trimethylolpropane diacrylate, neopentylglycol di(meth)acrylate, pentaerythritol tetra(meth)acrylate, pentaerythritol tri(meth) acrylate, dipentaerythritol hexa(meth)acrylate, dipentaerythritol penta(meth)acrylate, hexanediol di(meth)acrylate, trimethylolpropane tri(acryloyloxypropyl)ether, tri (acryloyloxyethyl) isocyanurate, tri(acryloyloxyethyl) cyanurate, glycerin tri(meth)acrylate; (meth)acrylate of an ethylene oxide or propylene oxide adduct of a polyfunctional alcohol such as trimethylol propane, and glycerin.

Further, there may be mentioned polyfunctional acrylates and methacrylates such as urethane acrylates described in Japanese Examined Application Publication Nos. 48-41708, 50-6034, and Japanese Patent Application Laid-Open No. 51-37193; polyester acrylates described in Japanese Patent Application Laid-Open No. 48-64183, Japanese Examined Application Publication Nos. 49-43191 and 52-30490; epoxy acrylates which are reaction products between epoxy resins and (meth)acrylic acid.

Among these, preferred are trimethylolpropane tri(meth)acrylate, pentaerythritol tetra(meth)acrylate, dipentaerythritol hexa(meth)acrylate, and dipentaerythritol penta(meth)acrylate.

Also, in addition to the above, there may be listed as a preferable material the "polymerizable compound B" described in Japanese Patent Application Laid-Open No. 11-133600.

As a photopolymerization initiator or photopolymerization initiator system to be used, there may be exemplified a vicinal polyketaldonyl compound disclosed in U.S. Pat. No. 2,367,660, an acyloin ether compound described in U.S. Pat. No. 2,448,828, an aromatic acyloin compound substituted by an α-hydrocarbon as described in U.S. Pat. No. 2,722,512, a polynuclear quinone compound described in U.S. Pat. Nos. 3,046,127 and 2,951,758, a combination of triaryl imidazole dimer and p-aminoketone described in U.S. Pat. No. 3,549,367, a benzothiazole compound and a trihalomethyl-s-triazine compound described in Japanese Examined Application Publication No. 51-48516, a trihalomethyl triazine compound described in U.S. Pat. No. 4,239,850, a trihalomethyloxadiazole compound described in U.S. Pat. No. 4,212,976. Especially preferred are trihalomethyl-s-triazine, trihalomethyloxadiazole, and triaryl imidazole dimer.

Also, in addition to the above, there may be exemplified as a preferable material the "polymerization initiator C" described in Japanese Patent Application Laid-Open No. 11-133600. The amount of the photopolymerization initiator to be used is, based on the solid content of the coating liquid, preferably 0.01% by mass to 20% by mass, more preferably 0.5% by mass to 10% by mass. Photo-irradiation to polymerize a liquid crystalline compound is preferably conducted by using ultraviolet ray. The irradiation energy is preferably 20 mJ/cm$^2$ to 50 J/cm$^2$, more preferably 100 mJ/cm$^2$ to 2,000 mJ/cm$^2$. In order to facilitate photopolymerization reaction, photo-irradiation may be carried out under a heating condition.

Examples of film-forming methods of the coating film 12 include a common solution coating method, or a vacuum film-forming method.

As the solution coating method, there may be exemplified a dip coating method, an air knife coating method, a curtain coating method, a roller coating method, a wire bar coating method, a gravure coating method, a slide coating method, or an extrusion coating method in which a hopper is used as described in U.S. Pat. No. 2,681,294.

Polymerization of acrylates and methacrylates is subject to inhibition by oxygen in air.

Therefore, in the present invention, when they are used as the coating film 12, it is preferable to lower the oxygen concentration or the oxygen partial pressure at the time of polymerization. When the oxygen concentration at the time of polymerization is lowered by a nitrogen replacement method, the oxygen concentration is preferably 2% or less, more preferably 0.5% or less. When the oxygen partial pressure at the time of polymerization is lowered by an evacuation method, the total pressure is preferably 1,000 Pa or less, more preferably 100 Pa or less. In addition, it is particularly preferable to carry out ultraviolet ray polymerization by irradiating energy of 2 J/cm$^2$ or more under a reduced pressure condition of 100 Pa or less.

In the present invention, the degree of polymerization of monomers is preferably 80% or more, more preferably 85% or more, still more preferably 90% or more. Here, the degree of polymerization means the ratio of polymerizable group which reacted to the total polymerizable groups (for example, an acryloyl group or a methacryloyl group in the case of acrylates or methacrylates) present in the monomer mixture.

When the laminate film (functional film) is used to produce a protective film for various devices and instruments such as display devices including an organic EL display and a liquid crystal display, it is sufficient to form a silicon oxide film and the like as the inorganic film 14.

Further, when producing optical films such as an antireflection film, a light reflection film, and various filters, it is sufficient to form, as the inorganic film 14, a film including a material which has or exhibits the desired optical properties.

Above all, especially, the present invention is best suited for production of a gas barrier film since the coating film 12 has excellent surface smoothness, which enables formation of the inorganic film 14 having a superior gas bather property. In addition, in the lamination, namely, when a coating film is further formed on the inorganic film, the effect of the present invention becomes more remarkable.

Heretofore, the method for producing a functional film of the present invention has been described in detail but the present invention is not limited to the above-described embodiments. It is a matter of course that various improvements and modifications can be made unless they depart from the scope of the present invention.

Hereinafter, the present invention will be described in more detail with reference to specific examples of the present invention.

A functional film was produced using the coating film-forming apparatus 20 and the inorganic film-forming apparatus 22, which are illustrated in FIG. 2.

A PET film of 1,000 mm in width and 100 μm in thickness was used as a substrate and then controlled so that the winding tension became constant in accordance with a winding diameter.

A coating film was obtained by dissolving acrylate monomers and a photopolymerization initiator in an organic solvent, and the solution was applied by a die coater, dried, and cured by ultraviolet ray curing treatment. The thickness of the coating film layer was controlled by an amount of the coating liquid fed so that the film thickness in a completely cured state became 1 μm.

Then, after the curing treatment, a laminate film was affixed to a surface of the coating film layer. More specifically, the laminate film was superimposed on the coated surface of the coating film layer after the ultraviolet ray was irradiated by the UV irradiation device. The laminate film was laminated onto the surface of the coating film without providing heat using a nip roll but with only the force of an adhesive layer having been applied on the laminate film.

Further, a similar laminate providing mechanism is also provided in the wind-up section to allow the place of affixing to change. When the laminate film was affixed, the film was stretched in the width direction by installing a spiral roller between the laminate film and the nip roller for nipping. In addition, this is for the purpose of preventing the substrate from being damaged by wrinkles and the like, the wrinkles and the like being caused by deformation of the substrate due to internal residual air, which arises when the laminate film is not affixed evenly and, upon exposure to vacuum, air between the laminate film and the coating film layer is not vacuumed out evenly.

Here, for the laminate film used, laminate films having different adhesive forces were prepared by changing the production method (material used for an adhesive layer, and film forming method), and the influence exerted by the adhesive force on the moisture permeability of each laminate film was examined. The laminate films used are shown in the following Table 1. Note that the adhesive forces shown in Table 1 were measured at using a tensile tester (Orientec, Tensilon universal tester) a tensile speed of 300 mm/min and a peel angle of 180° according to the tensile method JIS Z-0237. As the adherend, a PET film coated with a coating film layer was used. Additionally, the base material used for an adhesive film was PE (polyethylene) based resin, and the material used for the adhesive layer was EVA (ethylene-vinyl acetate copolymer) or PO (polyolefin).

Film rolls which have coating film layers formed under the above conditions were set in the inorganic film-forming apparatus 22, after, in order to remove air between the laminate film and the coating film layer as much as possible, they were left under atmospheric pressure for 1 hour or longer to allow air to escape by self-weight of the film roll. After the inorganic film-forming apparatus 22 was vacuum-evacuated, the laminate film 82 was peeled off either "immediately after" the base material roll (before the substrate passes through the pass roller 68 which contacts the coating film side of the substrate) or "immediately before" the film-forming drum 62 (after the substrate passed through the pass roller 68 which contacts the coating film side of the substrate), and then the inorganic film 14 was formed. In addition, when the laminate film was peeled off, in order to suppress increase in adhesion force under vacuum and, thus, movement of the film roll at the laminate film peel-off/wind-up section was controlled with the torque being regulated.

As for the inorganic film, aluminum was used as the target and an alumina film was formed by reactive sputtering to obtain a functional film 10.

The thus prepared functional film 10 was evaluated for performance by measuring moisture permeability, according to the following criteria.

[Evaluation Criteria for Performance (Moisture Permeability)]
D: $1.0 \times 10^{-3}$ g/m$^2$/day or more
C: $2.0 \times 10^{-4}$ g/m$^2$/day or more but less than $1.0 \times 10^{-3}$ g/m$^2$/day
B: $1.0 \times 10^{-4}$ g/m$^2$/day or more but less than $2.0 \times 10^{-4}$ g/m$^2$/day
A: Less than $1.0 \times 10^{-4}$ g/m$^2$/day laminate film in vacuum. It was also confirmed that under Condition 7, due to the too low peel force of the laminate film, folded wrinkles occurred in the laminate film when the coating film layer was wound up into a film roll, and the coating film layer suffered scratches by the contact with the wrinkles, which might be a cause of foreign matters. Further, it was confirmed that under Condition 8, although the peelability of the laminate film was excellent, a substantial amount of residues of EVA, serving as an adhesive material, were observed in the coating film layer underlying the laminate film, which might be a cause of foreign matters in formation of an inorganic film.

With the results described above, it became clear that as the adhesive force of an adhesion layer for use in a laminate film, the adhesion layer preferably has a peel force of 0.01 N/25 mm or more and 0.06 N/25 mm or less (evaluation grade: C or superior); and with a comparison between the result under Condition 3 and the result under Condition 8, to suppress the occurrence of residues of an adhesive material, an adhesive layer obtained by co-casting (co-extrusion) is preferable to an adhesive layer obtained by coating.

What is claimed is:

1. A method for producing a functional film, comprising the steps of:
feeding a substrate continuously from a film roll, forming a coating film on the substrate, providing a laminate film on a surface of the coating film in an ambient atmosphere, and winding up the resultant substrate into a film roll; and
loading the film roll wound up in the prior step into a vacuum film-forming apparatus, feeding the substrate provided with the laminate film continuously from the film roll, peeling off the laminate film, forming an inorganic film on the coating film on the substrate, and winding up the resultant substrate into a film roll,
wherein the laminate film is an adhesive film provided with an adhesive layer through co-casting, the adhesive layer having a peel force of 0.01 N/25 mm or more and 0.06 N/25 mm or less against the coating film.

TABLE 1

| Condition | Adhesion force (N/25 mm) | Production method of adhesive layer | Material for adhesive layer | Residue of adhesive | Moisture permeability (g/m$^2$/day) | Evaluation of performance |
|---|---|---|---|---|---|---|
| 1 | 0.125 | Coating method | EVA | Remained considerably | $2.0 \times 10^{-3}$ | D |
| 2 | 0.07 | Coating method | EVA | Remained | $1.6 \times 10^{-3}$ | D |
| 3 | 0.06 | Co-casting method | EVA | Not remained | $1.2 \times 10^{-4}$ | B |
| 4 | 0.04 | Co-casting method | PO | Not remained | $6.5 \times 10^{-5}$ | A |
| 5 | 0.02 | Co-casting method | PO | Not remained | $6.2 \times 10^{-5}$ | A |
| 6 | 0.01 | Co-casting method | PO | Not remained | $5.8 \times 10^{-5}$ | A |
| 7 | 0.002 | Co-casting method | PO | Not remained | $1.2 \times 10^{-3}$ | D |
| 8 | 0.06 | Coating method | EVA | Remained | $2.2 \times 10^{-3}$ | C |

In addition to the results shown in Table 1, it was confirmed that under Condition 1, the underlying base of the coating film layer was destroyed due to the too high peel force of the 2. The method for producing a functional film according to claim 1, wherein the functional film has a moisture permeability less than 1.0×10−3 g/m2/day.

3. The method for producing a functional film according to claim 2, wherein the coating film is formed from a material containing one of a radiation curable monomer and a radiation curable oligomer.

4. The method for producing a functional film according to claim 1, wherein the coating film is formed from a material containing one of a radiation curable monomer and a radiation curable oligomer.

5. The method for producing a functional film according to claim 1, wherein the coating film has a pencil hardness of B or higher, and average roughness per 10 µm square is 10 nm or less.

* * * * *